(12) United States Patent
Nieland

(10) Patent No.: US 10,211,823 B2
(45) Date of Patent: Feb. 19, 2019

(54) METHOD AND APPARATUS FOR PROTECTING GATE-SOURCE JUNCTION OF LOW-VOLTAGE MOSFET IN HIGH-VOLTAGE CIRCUIT

(71) Applicant: Nuvoton Technology Corporation, Hsinchu (TW)

(72) Inventor: Jan-Harm Nieland, Santa Clara, CA (US)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 325 days.

(21) Appl. No.: 15/209,602

(22) Filed: Jul. 13, 2016

(65) Prior Publication Data

US 2018/0019740 A1 Jan. 18, 2018

(51) Int. Cl.
*H03K 17/082* (2006.01)
*H01L 27/02* (2006.01)

(52) U.S. Cl.
CPC ..... *H03K 17/0822* (2013.01); *H01L 27/0266* (2013.01)

(58) Field of Classification Search
CPC ............. H03K 17/0822; H01L 27/0266
USPC .......................................... 327/309, 310–330
See application file for complete search history.

(56) References Cited

U.S. PATENT DOCUMENTS

| | | | | |
|---|---|---|---|---|
| 5,880,634 | A * | 3/1999 | Babanezhad | H03F 3/45475 327/557 |
| 5,936,445 | A * | 8/1999 | Babanezhad | G05F 3/242 327/148 |
| 6,617,906 | B1 * | 9/2003 | Hastings | H03K 5/08 327/309 |
| 2011/0298541 | A1 * | 12/2011 | Shi | H03F 3/45183 330/261 |
| 2013/0154733 | A1 * | 6/2013 | Lee | G06F 17/5063 330/149 |
| 2013/0222054 | A1 * | 8/2013 | Yendluri | H03F 3/211 327/552 |
| 2018/0198417 | A1 * | 7/2018 | Vijaykumar | H03F 1/301 |

* cited by examiner

*Primary Examiner* — Thomas Skibinski
(74) *Attorney, Agent, or Firm* — Kilpatrick Townsend & Stockton LLP

(57) ABSTRACT

A high-voltage circuit has a protection circuit protecting a low-voltage MOSFET. A first MOSFET, a low-voltage device with a gate coupled to an input voltage, is coupled in a series with a second MOSFET which is a high-voltage device, both of a first conductivity type. A protection circuit includes a third, a fourth, and a fifth MOSFET. The third MOSFET has a second conductivity type and source and body coupled to the input voltage. The fourth MOSFET has the first conductivity type and a drain coupled to a drain of the third MOSFET, a gate coupled to a second bias voltage, and a source and a body coupled to the first power terminal. The fifth MOSFET has the first conductivity type and a drain coupled to the input voltage, a gate coupled to the drain of the fourth MOSFET, and a source coupled to the first power terminal.

20 Claims, 5 Drawing Sheets

METHOD AND APPARATUS FOR PROTECTING GATE-SOURCE JUNCTION OF LOW-VOLTAGE MOSFET IN HIGH-VOLTAGE CIRCUIT

BACKGROUND OF THE INVENTION

Integrated circuit manufacturing processes often provide devices with different breakdown voltages. Sometimes it may be advantageous to use low-voltage devices in a high-voltage portion of the circuit. In that case, the low-voltage device has to be protected against high-voltages. Protecting the drain-source of a MOSFET (Metal Oxide Semiconductor Field Effect Transistor) device, for example, can be achieved using a high-voltage MOSFET arrangement in which two MOSFETs are stacked. The gate-source voltage can be protected, for example, with multiple diodes connected between the gate and the source.

The inventor has identified several disadvantages in conventional circuits using diodes for protecting the gate-source junction of a low-voltage device, as described further below.

BRIEF SUMMARY OF THE INVENTION

As described above, conventional protection circuits for a low-voltage device in a high-voltage circuit are not satisfactory. The inventor has identified several disadvantages. For example, diode protection circuits do not have the same temperature behavior as MOSFETs. Another disadvantage is that, if a different maximum voltage is needed, the diodes have to be stacked, meaning that the smallest step size in increasing or decreasing the maximum voltage for a circuit is the forward voltage of a diode, which is quite high for modern processes (because the maximum voltage is smaller). For example, in a high-voltage circuit with a power supply voltage of 5 V, the low-voltage devices may be configured to operate at 1.65 V, which is not an integer multiple of a diode turn-on voltage Therefore, it is difficult to provide proper protection using diodes.

Embodiments of the present invention provide improved protection circuits for protecting low-voltage devices in high-voltage circuits. In an embodiment, the protection circuit includes a PMOS (P-type Metal-Oxide-Semiconductor) transistor and two NMOS (N-type Metal-Oxide-Semiconductor) transistors in a feedback configuration. In another embodiment, the protection circuit includes an NMOS transistor and two PMOS transistors in a feedback configuration. Embodiments of the present invention provide protection circuits that offer many advantages over conventional protection circuits. For example, the protection circuit can be implemented in low-voltage devices. For example, in a process with deep wells or in an SOI process, the protection circuit can be implemented in low voltage devices. But if a bulk process does not have deep wells, some devices in the protection circuit to protect a low voltage device will be high voltage devices, as explained further below. If available, a native high voltage device can be used. Here, a native NMOS is an NMOS with a very low threshold voltage. Further, the protection circuit consumes no power in normal operating mode. As a result, it only adds a small capacitance to the node it is configured to protect. Moreover, the implementation using MOS transistors is area efficient compared to conventional protection circuits using diodes, especially if a large amount of current has to be absorbed.

According to embodiments of the present invention, a high-voltage circuit has a protection circuit for protecting a low-voltage MOSFET (Metal-Oxide-Semiconductor Field Effect Transistor). The high-voltage devices are configured to operate with a power supply voltage and low-voltage devices are configured to operate with a maximum allowable voltage lower than the power supply voltage. In the high-voltage circuit, a first MOSFET is a low-voltage device of a first conductivity type and has a gate coupled to an input voltage and a source coupled to a first power terminal. A second MOSFET is a high-voltage device of the first conductivity type and in a cascode or series connection with the first MOSFET. The second MOSFET has a source coupled to a drain of the first MOSFET and a gate coupled to a first bias voltage. A protection circuit is configured for protecting the gate-source junction of the first MOSFET. The protection circuit includes a third, a fourth, and a fifth MOSFET. The third MOSFET is a device of a second conductivity type and has a source coupled to the input voltage. The fourth MOSFET is a device of the first conductivity type and has a drain coupled to a drain of the third MOSFET, a gate coupled to a second bias voltage, and a source and a body coupled to the first power terminal. The fifth MOSFET is a device of the first conductivity type and has a drain coupled to the input voltage, a gate coupled to the drain of the fourth MOSFET, and a source coupled to the first power terminal.

In some embodiments, the gate voltage of the third MOSFET is configured such that the gate voltage plus the gate source voltage of the third MOSFET is configured to be lower than the maximum allowed voltage of the first MOSFET.

In an embodiment, the power supply voltage is 5 V, and the maximum allowable voltage for the low-voltage devices is 1.65 V.

In the circuit described above, devices of the first and second conductivity types can be either NMOS transistors (N-type MOSFETs) or PMOS transistors (P-type MOSFETs). In the version of NMOS transistors, the power terminal is the electrical ground terminal. In the version of PMOS transistors, the power terminal is the power supply terminal.

In the above embodiment, the first MOSFET and the second MOSFET form a cascode circuit. In another embodiment, the first MOSFET and the second MOSFET can form a current mirror with a sixth MOSFET and a seventh MOSFET. The sixth MOSFET is a low-voltage device of a first conductivity type and has a gate coupled to an input voltage and a source coupled to a first power supply terminal. The seventh MOSFET is a high-voltage device of the first conductivity type and in a cascode or series connection with the sixth MOSFET. The seventh MOSFET has a source coupled to a drain of the sixth MOSFET and a gate coupled to a first bias voltage.

In an embodiment, the third, fourth, and fifth MOSFETs are configured as a unity gain operational amplifier.

In an alternative embodiment, the protection circuit can include an additional resistor R disposed between the source of the third MOSFET and the drain of the fifth MOSFET. The effect of the resistor is that, if the protection circuit has to absorb more current, the voltage on the gate of the low-voltage device becomes lower.

A further understanding of the nature and advantages of the present invention may be realized by reference to the remaining portions of the specification and the drawings.

DETAILED DESCRIPTION OF THE INVENTION

A cascode circuit is often used in analog circuit design. In a conventional circuit, a cascode can include two MOSFETs coupled in series, i.e., a common-source stage and a current source with a fixed gate bias. In conventional high-voltage applications, a cascode circuit has two high-voltage MOSFETs stacked together. It is desirable to have a low-voltage device in the lower stage of a cascode circuit, because the low-voltage device provides better frequency response and wider bandwidth. In order to use low-voltage devices in a high-voltage circuit, the low-voltage device needs to be protected against a high-voltage across its terminals.

Figure 1:
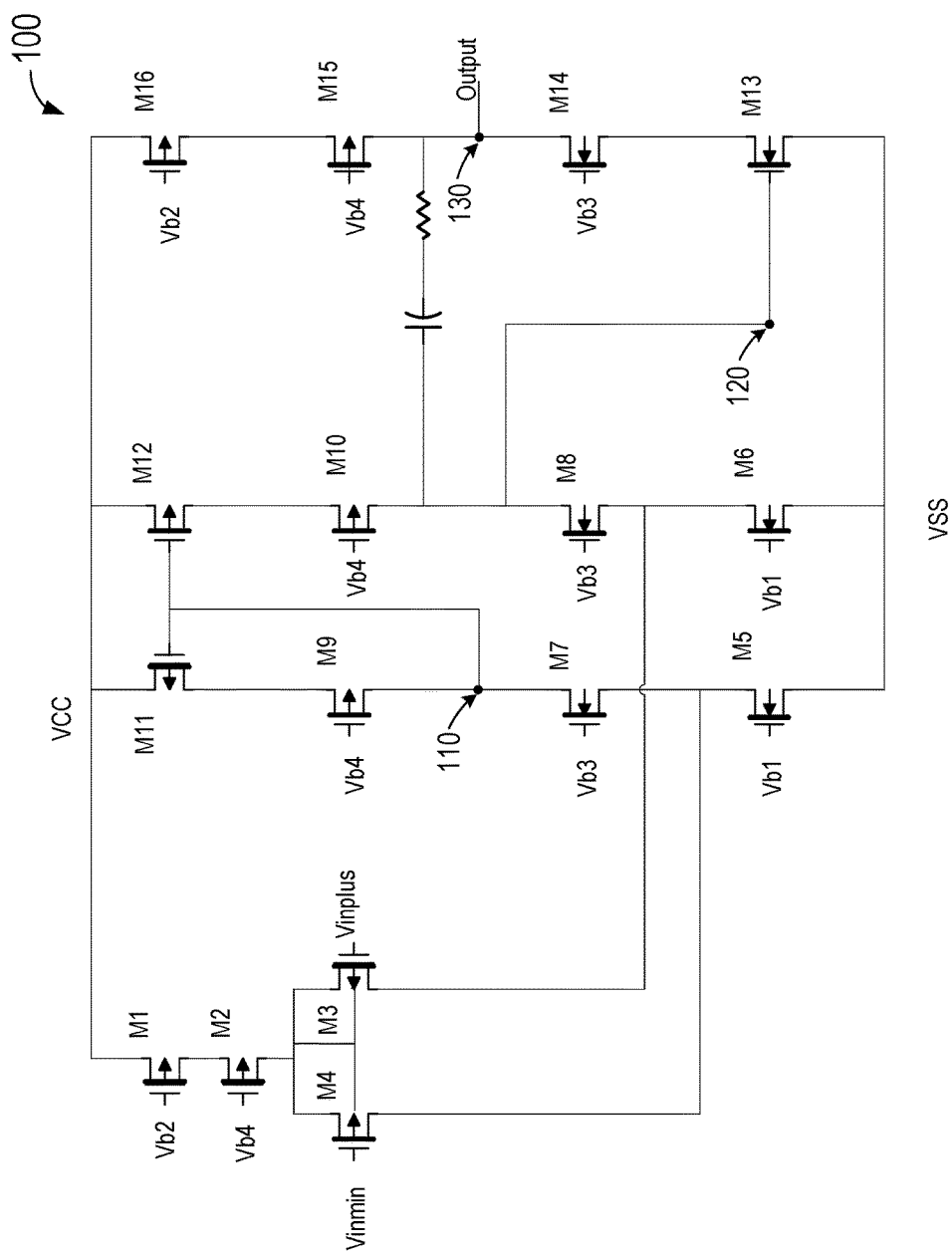
FIG. 1 is schematic diagram illustrating a two-stage amplifier circuit implemented using high-voltage MOS transistors according to an embodiment of the present invention.
Figure 2:
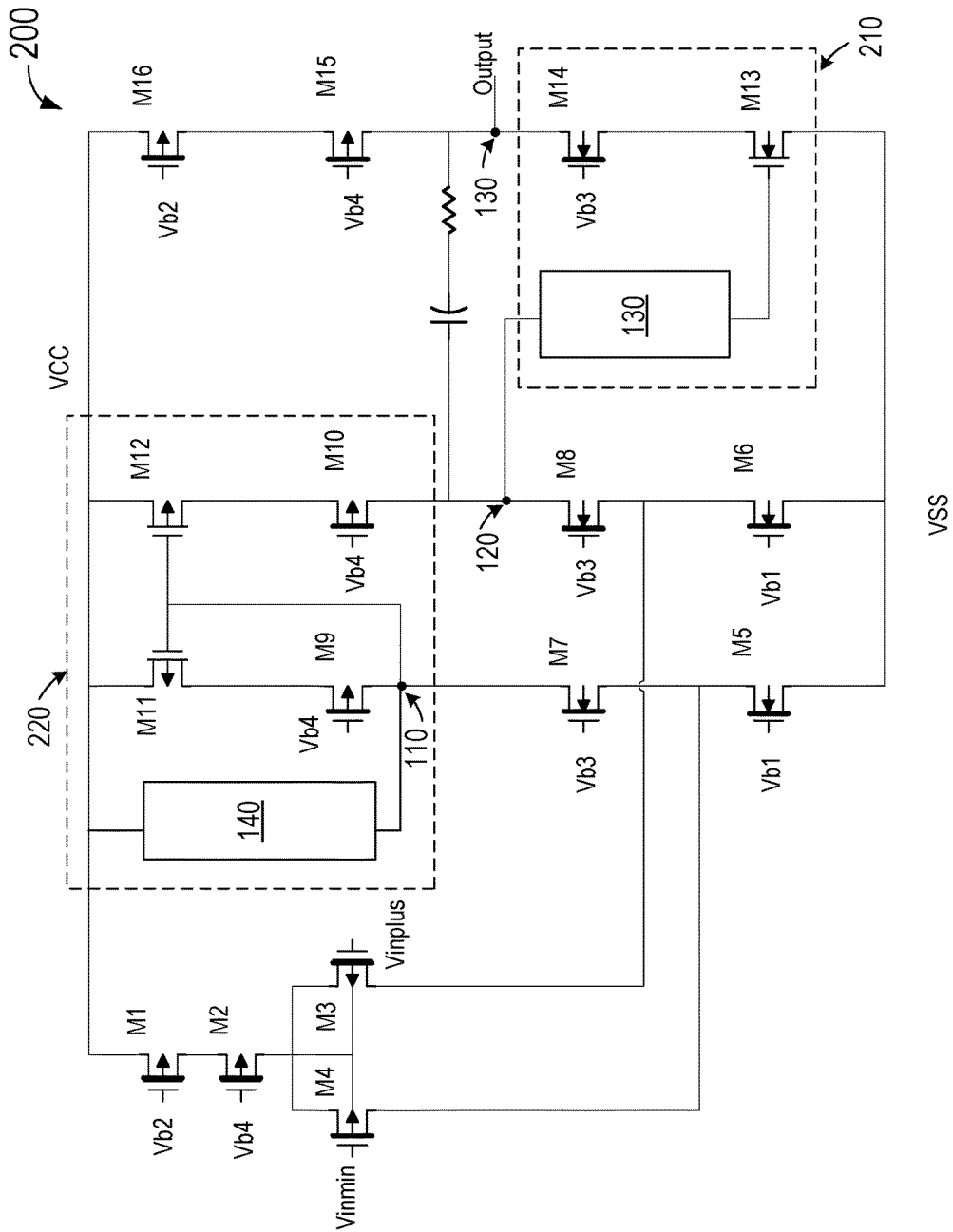
FIG. 2 is a schematic diagram illustrating the two-stage amplifier circuit of FIG. 1 that includes protection circuits that allow certain high-voltage MOS transistors to be replaced by low-voltage MOS transistors according to another embodiment of the present invention.

FIG. 1 is schematic diagram illustrating a two-stage amplifier circuit implemented using high-voltage MOS transistors according to an embodiment of the present invention. FIG. 2 is a schematic diagram illustrating the two-stage amplifier circuit of FIG. 1 that includes protection circuits that allow certain high-voltage MOS transistors to be replaced by low-voltage MOS transistors according to another embodiment of the present invention. As used herein, high-voltage devices are configured to operate with a power supply voltage, and low-voltage devices are configured to operate with a maximum allowable voltage lower than the power supply voltage. For example, in an embodiment, the power supply voltage is 5 V, and the high-voltage devices are configured to operate with 5 V, and low-voltage devices are configured to operate with a maximum allowable voltage lower than the power supply voltage, e.g., 1.65 V.

As shown in FIG. 1, amplifier circuit 100 includes PMOS transistors M1-M4, M9-M12, and M15-M16, as well as NMOS transistors M5-M8 and M13-M14. In some embodiments, amplifier circuit 100 can operate as an operational amplifier. In this embodiment, all MOS transistors M1-M16 are high-voltage transistors.

In amplifier 100, M3 and M4 form a differential pair with M1 and M2 as a cascoded tail current source. M5-M12 form a folded cascode current mirror which converts the differential output current of M3 and M4 into a single ended current, which drives the gate of M13, which is configured as common source stage, cascoded by M14. M15 and M16 forming a current source biasing the common source stage. The output is taken at the output node 130.

In FIG. 1, VCC positive supply voltage, and VSS is a ground. Vb1 is a bias voltage for NMOS current sources, Vb2 is bias voltage for PMOS current sources, Vb3 is a bias voltage for NMOS cascodes, and Vb4 is a bias voltage PMOS cascodes. In some embodiments, backgates of PMOS transistors are connected to VCC unless indicated otherwise, and backgates of NMOS transistors are connected to VSS unless indicated otherwise.

As shown in FIG. 1, amplifier circuit 100 includes high-voltage cascode circuits with two stacked MOS transistors, for example, M13 and M14, M9 and M11, and M10 and M12. It can be desirable to have a low-voltage device in the lower stage of a cascode circuit, because the low-voltage device provides better frequency response and wider bandwidth. In order to use low-voltage devices in a high-voltage circuit, the low-voltage device needs to be protected against a high-voltage across its terminals.

FIG. 2 is a schematic diagram illustrating the two-stage amplifier circuit of FIG. 1 that includes protection circuits that allow certain high-voltage MOS transistors to be replaced by low-voltage MOS transistors according to another embodiment of the present invention. As shown in FIG. 2, amplifier circuit 200 is similar to amplifier 100 in FIG. 1. The differences include using a low-voltage device M13 in the cascoded common source stage M13 and M14 in FIG. 2. Similarly, low-voltage devices M11 and M12 are used in a current mirror formed by M9-M12 that includes two cascode pairs, M9 and M11, and M10 and M12. FIG. 2 also includes protection circuits 130 and 140 to protect low-voltage devices M11, M12, and M13 so that they can operate with a power supply voltage VCC higher than the maximum allowable voltage for these low-voltage devices.

Figure 3:
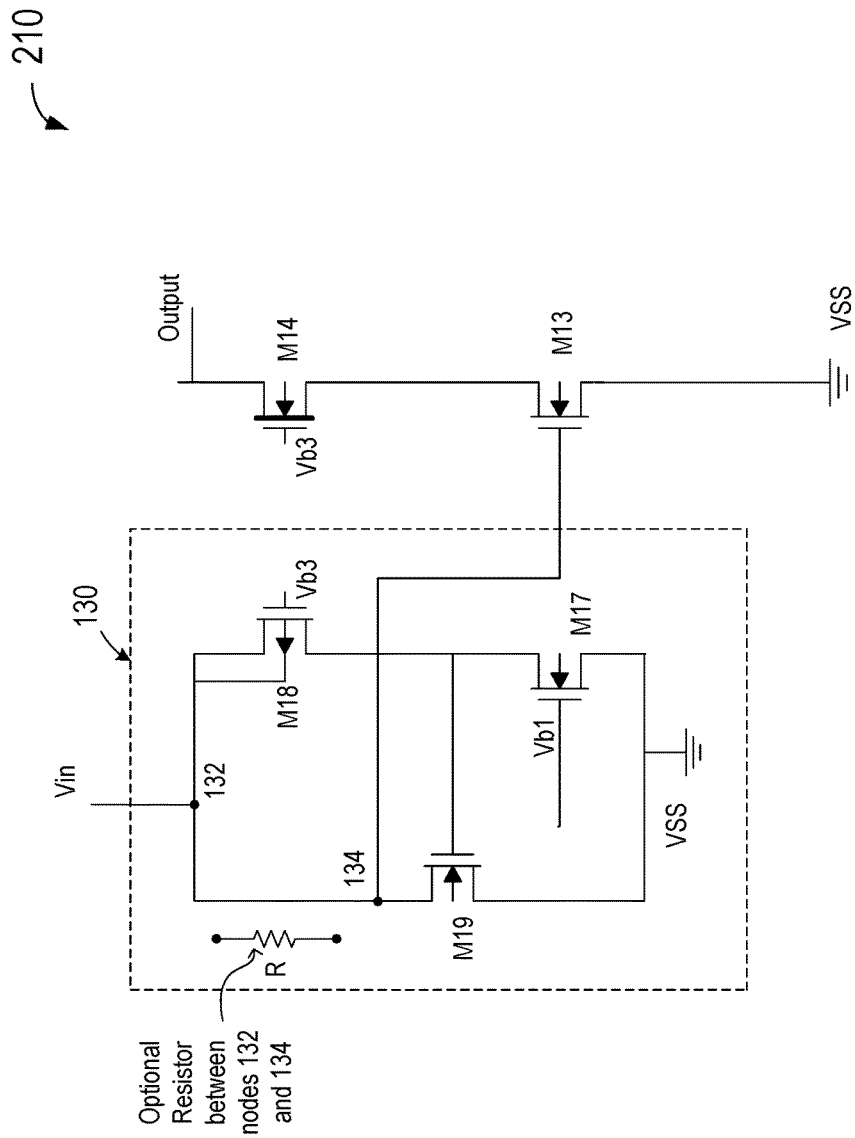
FIG. 3 is a schematic diagram illustrating a portion of amplifier 200 in FIG. 2 as shown in the block 210 according to an embodiment of the present invention.

FIG. 3 is a schematic diagram illustrating a portion of amplifier 200 in FIG. 2 as shown in the block 210, including low-voltage NMOS transistor M13, high-voltage NMOS transistor M14, and protection circuit 130. As shown in FIG. 3, a high-voltage circuit 210 includes a first MOSFET, being a low-voltage NMOS device M13 and having a gate coupled to an input voltage Vin from node 120 in FIG. 2 and a source coupled to a ground VSS. A second MOSFET M14 is a high-voltage NMOS device and is in a cascode or series connection with the first MOSFET M13. The second MOSFET M14 has a source coupled to a drain of the first MOSFET M13 and a gate coupled to a first bias voltage Vb3. FIG. 3 also shows a protection circuit 130 for protecting the gate-source junction of the first MOSFET M13. Protection circuit 130 includes a third MOSFET 18, a fourth MOSFET M17, and a fifth MOSFET M19. The third MOSFET M18 is a PMOS device and has a source and a body coupled to the input voltage, and a gate coupled to the first bias voltage Vb3. The fourth MOSFET M17 is a NMOS device and has a drain coupled to a drain of the third MOSFET M18, a gate coupled to a second bias voltage Vb1, and a source and a body coupled to the ground VSS. The fifth MOSFET M19 is a NMOS device and has a drain coupled to the input voltage, a gate coupled to the drain of the fourth MOSFET M17, and a source coupled to the ground VSS. In embodiments of the invention, the gate voltage plus the gate source voltage of the third MOSFET M18 are configured to be lower than the maximum allowed voltage of the first MOSFET M13.

In FIG. 3, low-voltage device M13 is in a cascoded or series connection with high-voltage devices M14. Protection circuit 130 is configured to keep the gate-source voltage of M13 below its maximum allowed value. Protection circuit 130 includes PMOS device M18 and NMOS devices M17 and M19. M17 is a current source, biasing M18. If the voltage on the source of M18 is lower than the voltage at its gate plus the magnitude of the threshold voltage of M18, M18 is off. Current source M17 pulls the gate of M19 to ground VSS, keeping it off. If the voltage at the source of M18, which is also the voltage at the gate of M13, becomes higher than the gate voltage of M18 plus the threshold voltage, M18 turns on, and the circuits M18, M17 and M19 become a three transistor opamp (operational amplifier). The positive input of this opamp is the gate of M18; the negative input is the source of M18 and the output is the drain of M18. Since the output of the opamp is coupled to its negative input, the opamp works in unity gain mode. That means it copies the input voltage to the output. It only adds a DC component, the gate source voltage of M18. If the voltage at the positive input of the opamp, the gate of M18, plus the gate source voltage of M18 is lower than the maximum allowed voltage of the low-voltage devices M13, this circuit will protect M13.

In embodiments of the present invention, protection circuit 130 is configured such that, in the case of the gate voltage of M18, the output voltage of the opamp will always be lower than the allowed maximum voltage of the low-voltage devices. In the embodiment of FIG. 3, the gate of M17 is coupled to bias voltage Vb1, which is also a bias voltage for NMOS cascode devices. However, the gate of M18 can also receive a separate bias voltage. The value of the bias voltage can also depend on the width and length (W/L) of the device and bias current of M18 and temperature and process variations.

In an alternative embodiment, protection circuit 130 in FIG. 3 can include an additional resistor R between the source of M18 and the drain of M19, i.e., between nodes 132 and 134. The gate of M13 is connected to the drain of M19. The effect of the resistor is that, if the protection circuit has to absorb more current, the voltage on the gate of M13 becomes lower.

Figure 4:
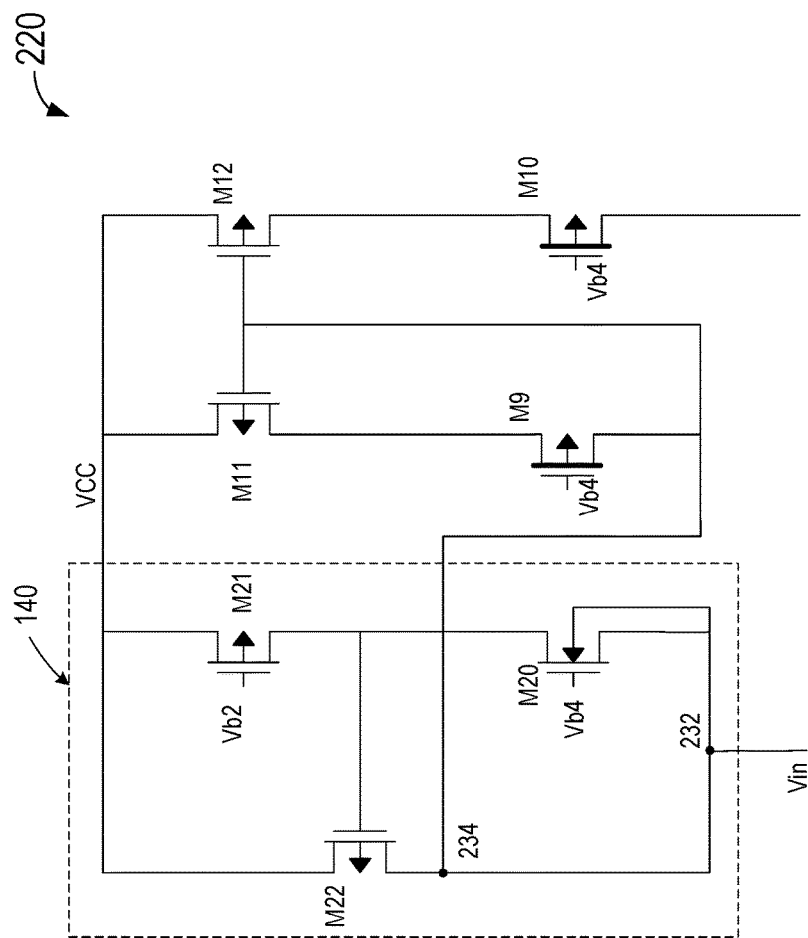
FIG. 4 is a schematic diagram illustrating a portion of amplifier 200 in FIG. 2 as shown in the block 220 according to an embodiment of the present invention.

FIG. 4 is a schematic diagram illustrating a portion of amplifier 200 in FIG. 2 as shown in the block 220, including PMOS transistors M9-M12 and protection circuit 140. Protection circuit 140 is a PMOS version of protection circuit 130 described above in connection with FIG. 3. In FIG. 4, PMOS devices M10 and M12 form a cascode circuit, similar to NMOS devices M14 and M13 in FIG. 3. As shown in FIG. 4, circuit block 220 includes a first MOSFET, being a low-voltage PMOS device M12 and having a gate coupled to an input voltage Vin and a source coupled to a power supply VCC. Circuit block 220 also includes a second MOSFET, being a high-voltage PMOS device M10 and in a cascode or series connection with the first MOSFET M12, the second MOSFET having a source coupled to a drain of the first MOSFET and a gate coupled to a first bias voltage Vb4. In addition, M9-M12 form a current mirror, as described below. Circuit block 220 also includes a protection circuit 140 for protecting the gate-source junction of the first MOSFET M12. The protection circuit 140 includes a third MOSFET M20, a fourth MOSFET M17, and a fifth MOSFET M19. The third MOSFET M20 is an NMOS device and has a source and a body coupled to the input voltage Vin and a gate coupled to the first bias voltage Vb4. The fourth MOSFET M21 is a PMOS device and has a drain coupled to a drain of the third MOSFET, a gate coupled to a second bias voltage Vb2, and a source and a body coupled to power terminal VCC. The fifth MOSFET M22 is a PMOS device and has a drain coupled to the input voltage Vin, a gate coupled to the drain of the fourth MOSFET M21, and a source coupled to power terminal VCC. In some embodiments of the present invention, the gate voltage plus the gate source voltage of the third MOSFET M20 are configured to be lower than the maximum allowed voltage of the first MOSFET M12.

The operation of protection circuit 140 in FIG. 4 is similar to the operation of protection circuit 130 in FIG. 3 described above. Those skilled in the art can appreciate that the description of protection circuit 130 can be applied to protection circuit 140 with NMOS replaced by PMOS, and ground terminal replaced by power supply terminal.

In an alternative embodiment, protection circuit 140 in FIG. 4 can include an additional resistor R between the source of M20 and the drain of M22, i.e., between nodes 232 and 234. The gates of M11 and M12 are connected to the drain of M22. The effect of the resistor is that if the protection circuit has to absorb more current, the voltage on the gates of M11 an M12 becomes even lower.

In the above embodiment, the first MOSFET and the second MOSFET form a cascoded common source amplifier circuit. In another embodiment, the first MOSFET and the second MOSFET can form a cascoded current mirror with a sixth MOSFET and a seventh MOSFET. The sixth MOSFET is a low-voltage device of a first conductivity type and has a gate coupled to an input voltage and a source coupled to a first power supply terminal. The seven MOSFET is a high-voltage device of the first conductivity type and in a cascode or series connection with the first MOSFET. The seventh MOSFET has a source coupled to a drain of the sixth MOSFET and a gate coupled to a first bias voltage. The current source in FIG. 4 is formed with PMOS transistors. In alternative embodiments, the protection circuit 130 described in FIG. 3 can also be used to protect a current source formed by NMOS transistors.

In some embodiments, the protection circuits can be implemented in low-voltage devices. For example, in a process with deep N-well or in an SOI process, the protection circuit, including the third MOSFET, thee fourth MOSFET, and the fifth MOSFET, can be implemented in low voltage devices. But if a bulk process does not have deep N-well, or if it is not used, the NMOS device (M20 in the protection circuit of FIG. 4) in the protection circuit to protect a low voltage PMOS device is a high voltage device. Similarly, without a deep P-well, the PMOS device (M18 in the protection circuit of FIG. 3) is a high voltage device. If available, a native high voltage NMOS can be used. Here, a native NMOS is an NMOS with a very low threshold voltage.

The protection circuits according to embodiments of the invention offer many advantages over conventional protection circuits. As described above, the protection circuits consumes no power in normal operating mode. As a result, it only adds a small capacitance to the node it is configured to protect. In normal operating mode, the devices in the protection circuit connected to the gate of the device to be protected (devices M18 and M19 in FIG. 3) are off, that means there is no channel or inversion layer under the gate. Connecting the backgate or bulk of M18 adds capacitance to node 132 of FIG. 3, but the size of M18 can be small, and if it is really an issue, the backgate can be connected to VCC. In that case only the source of M18 would contribute some capacitance to node 132, and that would be the capacitance of a reverse biased pn junction. The drain of M19 also contributes the capacitance of a reverse biased pn junction. The capacitance of a reverse biased pn junction becomes smaller if the voltage across that junction increases. The capacitance in this protection circuit is smaller compare with the circuit that uses diodes to protect the low voltage device, between node 132 and VSS in FIG. 3. The diodes will be forward biased if the voltage at node 132 becomes too high. The capacitance of the diodes becomes higher, with a higher voltage on node 132, because the depletion region in the diodes becomes smaller as the voltage across a diode gets closer to the forward voltage. The implementation using MOS transistors is area efficient compared to conventional protection circuits using diodes, especially if a large amount of current has to be absorbed.

According to embodiments of the present invention, a general version of the high-voltage circuit can be described below that includes the NMOS version depicted in FIG. 3 and the PMOS version depicted in FIG. 4. In this version, devices of the first and second conductivity types can be either NMOS transistors (N-type MOSFETs) or PMOS transistors (P-type MOSFETs), and the power terminal can be either the electrical ground terminal or the power supply terminal. The high-voltage circuit includes a low-voltage MOSFET (Metal-Oxide-Semiconductor Field Effect Transistor) and a protection circuit, wherein high-voltage devices are configured to operate with a power supply voltage and low-voltage devices are configured to operate with a maximum allowable voltage lower than the power supply voltage. A first MOSFET is a low-voltage device of a first conductivity type and has a gate coupled to an input voltage and a source coupled to a first power terminal. A second MOSFET is a high-voltage device of the first conductivity type and in a cascode or series connection with the first MOSFET. The second MOSFET has a source coupled to a drain of the first MOSFET and a gate coupled to a first bias voltage. A protection circuit is configured for protecting the gate-source junction of the first MOSFET. The protection circuit includes a third, a fourth, and a fifth MOSFET. The third MOSFET is a device of a second conductivity type and has a source and a body coupled to the input voltage. The fourth MOSFET is a device of the first conductivity type and has a drain coupled to a drain of the third MOSFET, a gate coupled to a second bias voltage, and a source and a body coupled to the first power terminal. The fifth MOSFET is a device of the first conductivity type and has a drain coupled to the input voltage, a gate coupled to the drain of the fourth MOSFET M17, and a source coupled to the first power terminal.

In the circuit described above, devices of the first and second conductivity types can be either NMOS transistors (N-type MOSFETs) or PMOS transistors (P-type MOSFETs). In the version of NMOS transistors, the power terminal is the electrical ground terminal, as depicted in FIG. 3. In the version of PMOS transistors, the power terminal is the power supply terminal, as depicted in FIG. 4.

In the above embodiment, the first MOSFET and the second MOSFET form a cascoded common source amplifier circuit. In another embodiment, the first MOSFET and the second MOSFET can form a current mirror with a sixth MOSFET and a seventh MOSFET. The sixth MOSFET is a low-voltage device of a first conductivity type and has a gate coupled to an input voltage and a source coupled to a first power supply terminal. The seventh MOSFET is a high-voltage device of the first conductivity type and in a cascode or series connection with the first MOSFET. The seventh MOSFET has a source coupled to a drain of the sixth MOSFET and a gate coupled to a first bias voltage.

In an alternative embodiment, a protection circuit can include an additional resistor R as described above in connection with FIGS. 3 and 4. The effect of the resistor is that, if the protection circuit has to absorb more current, the voltage on the gate of the low-voltage device becomes lower.

Figure 5:
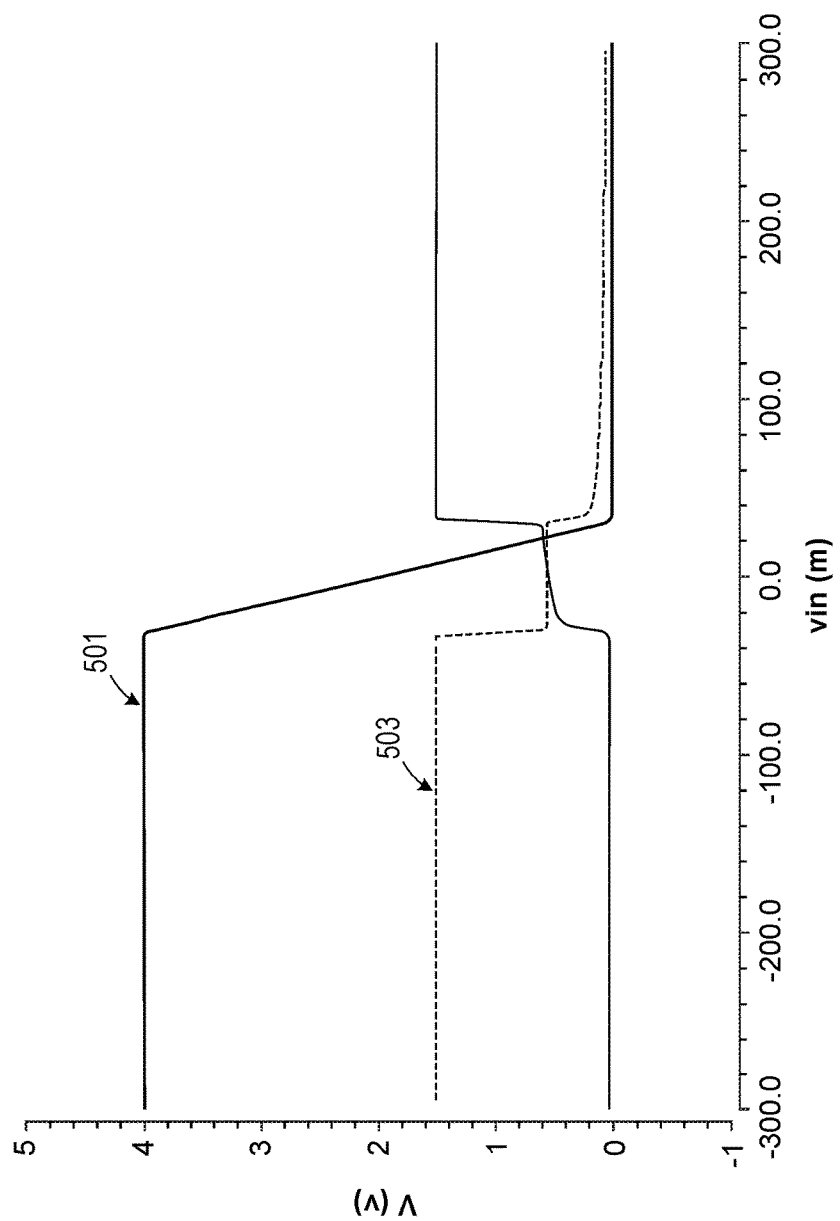
FIG. 5 is a waveform diagram illustrating a simulation result of the operation of the protection circuit described above in connection with FIG. 2.

FIG. 5 is a waveform diagram illustrating the simulation result of the operation of the protection circuit described above in connection with FIG. 2. Curve 501 illustrates the voltage change at the output node 130 in FIG. 2, and curve 503 illustrates the change of the gate voltage of low-voltage MOS device M13 in FIG. 2. It can be seen that as the output voltage varies between 0 and 4 V, the variation of the gate-source voltage of MOS transistor M13 is below the maximum allowed value of 1.65 V for low-voltage devices.

While the above is a description of specific embodiments of the invention, the description should not be taken as limiting the scope of the invention. It is understood that the examples and embodiments described herein are for illustrative purposes only and that various modifications or changes can be made in light thereof.

What is claimed is:

1. A high-voltage circuit including a protection circuit for protecting a low-voltage MOSFET (Metal-Oxide-Semiconductor Field Effect Transistor), wherein high-voltage devices are configured to operate with a power supply voltage and low-voltage devices are configured to operate with a maximum allowable voltage lower than the power supply voltage, the high-voltage circuit comprising:
    a first MOSFET, being a low-voltage device of a first conductivity type and having a gate coupled to an input voltage and a source coupled to a first power terminal;
    a second MOSFET, being a high-voltage device of the first conductivity type and in a series connection with the first MOSFET, the second MOSFET having a source coupled to a drain of the first MOSFET and a gate coupled to a first bias voltage; and
    a protection circuit for protecting the gate-source junction of the first MOSFET, the protection circuit including:
        a third MOSFET, being a device of a second conductivity type and having a source to the input voltage;
        a fourth MOSFET, being a device of the first conductivity type and having a drain coupled to a drain of the third MOSFET, a gate coupled to a second bias voltage, and a source and a body coupled to the first power terminal; and
        a fifth MOSFET, being a device of the first conductivity type and having a drain coupled to the input voltage, a gate coupled to the drain of the fourth MOSFET, and a source coupled to the first power terminal.

2. The circuit of claim 1, wherein the gate voltage of the third MOSFET is configured such that the gate voltage plus the gate source voltage of the third MOSFET is configured to be lower than the maximum allowed voltage of the first MOSFET.

3. The circuit of claim 1, wherein:
    the first conductivity type is N-type;
    the second conductivity type is P-type; and
    the first power terminal is a ground terminal.

4. The circuit of claim 1, wherein:
    the first conductivity type is P-type;
    the second conductivity type is N-type; and
    the first power terminal is a power supply terminal.

5. The circuit of claim 1, wherein the third, fourth, and fifth MOSFETs are configured as a unity gain operational amplifier.

6. The circuit of claim 1, wherein a body of the first MOSFET is coupled to the first power terminal, and a body of second MOSFET is coupled to the first power terminal or a source of the second MOSFET.

7. The circuit of claim 1, wherein the protection circuit further comprises a resistor disposed between the source of the third MOSFET and the drain of the fifth MOSFET.

8. The circuit of claim 1, wherein the power supply voltage is 5 V, and the maximum allowable voltage for the low-voltage devices is 1.65 V.

9. The circuit of claim 1, further comprising:
a sixth MOSFET, being a low-voltage device of a first conductivity type and having a gate coupled to an input voltage and a source coupled to a first power supply terminal;
a seven MOSFET, being a high-voltage device of the first conductivity type and in a series connection with the first MOSFET, the second MOSFET having a source coupled to a drain of the first MOSFET and a gate coupled to a first bias voltage;
wherein the first MOSFET, the second MOSFET, the sixth MOSFET, and the seven MOSFET are configured to form a current mirror.

10. The circuit of claim 9, wherein a body of the sixth MOSFET is coupled to the first power terminal, and a body of seventh MOSFET is coupled to the first power terminal or a source of the seventh MOSFET.

11. A high-voltage circuit including a protection circuit for protecting a low-voltage MOSFET device, wherein high-voltage devices are configured to operate with a power supply voltage and low-voltage devices are configured to operate with a maximum allowable voltage lower than the power supply voltage, the high-voltage circuit comprising:
a first MOSFET, being a low-voltage NMOS device and having a gate coupled to an input voltage and a source coupled to a ground;
a second MOSFET, being a high-voltage NMOS device and in a series connection with the first MOSFET, the second MOSFET having a source coupled to a drain of the first MOSFET and a gate coupled to a first bias voltage; and
a protection circuit for protecting the gate-source junction of the first MOSFET, the protection circuit including:
a third MOSFET, being a PMOS device and having a source and a body coupled to the input voltage, and a gate coupled to the first bias voltage;
a fourth MOSFET, being a NMOS device and having a drain coupled to a drain of the third MOSFET, a gate coupled to a second bias voltage, and a source and a body coupled to the ground; and
a fifth MOSFET, being a NMOS device and having a drain coupled to the input voltage, a gate coupled to the drain of the fourth MOSFET, and a source coupled to the ground.

12. The circuit of claim 11, wherein the gate voltage of the third MOSFET is configured such that the gate voltage plus the gate source voltage of the third MOSFET is configured to be lower than the maximum allowed voltage of the first MOSFET.

13. The circuit of claim 11, further comprising:
a sixth MOSFET, being a low-voltage device of a first conductivity type and having a gate coupled to an input voltage and a source coupled to a first power supply terminal;
a seventh MOSFET, being a high-voltage device of the first conductivity type and in a series connection with the first MOSFET, the second MOSFET having a source coupled to a drain of the first MOSFET and a gate coupled to a first bias voltage;
wherein the first MOSFET, the second MOSFET, the sixth MOSFET, and the seventh MOSFET are configured to form a current mirror.

14. The circuit of claim 11, wherein the protection circuit further comprises a resistor disposed between the source of the third MOSFET and the drain of the fifth MOSFET.

15. The circuit of claim 11, wherein the power supply voltage is 5 V, and the maximum allowable voltage for the low-voltage devices is 1.65 V.

16. A high-voltage circuit including a protection circuit for protecting a low-voltage MOSFET device, wherein high-voltage devices are configured to operate with a power supply voltage and low-voltage devices are configured operate with a maximum allowable voltage lower than the power supply voltage, the high-voltage circuit comprising:
a first MOSFET, being a low-voltage PMOS device and having a gate coupled to an input voltage and a source coupled to a power supply;
a second MOSFET, being a high-voltage PMOS device and in a series connection with the first MOSFET, the second MOSFET having a source coupled to a drain of the first MOSFET and a gate coupled to a first bias voltage; and
a protection circuit for protecting the gate-source junction of the first MOSFET, the protection circuit including:
a third MOSFET, being an NMOS device and having a source coupled to the input voltage and a gate coupled to the first bias voltage;
a fourth MOSFET, being a PMOS device and having a drain coupled to a drain of the third MOSFET, a gate coupled to a second bias voltage, and a source and a body coupled to a power supply terminal; and
a fifth MOSFET, being a PMOS device of the first conductivity type and having a drain coupled to the input voltage, a gate coupled to the drain of the fourth MOSFET, and a source coupled to the power supply terminal.

17. The circuit of claim 16, wherein the gate voltage of the third MOSFET is configured such that the gate voltage plus the gate source voltage of the third MOSFET are configured to be lower than the maximum allowed voltage of the first MOSFET.

18. The circuit of claim 16, further comprising:
a sixth MOSFET, being a low-voltage device of a first conductivity type and having a gate coupled to an input voltage and a source coupled to a first power supply terminal;
a seventh MOSFET, being a high-voltage device of the first conductivity type and in a series connection with the first MOSFET, the second MOSFET having a source coupled to a drain of the first MOSFET and a gate coupled to a first bias voltage;
wherein the first MOSFET, the second MOSFET, the sixth MOSFET, and the seventh MOSFET are configured to form a current mirror.

19. The circuit of claim 16, wherein the protection circuit further comprises a resistor disposed between the source of the third MOSFET and the drain of the fifth MOSFET.

20. The circuit of claim 16, wherein the power supply voltage is 5 V, and the maximum allowable voltage for the low-voltage devices is 1.65 V.

\* \* \* \* \*